(12) United States Patent
Matsumori et al.

(10) Patent No.: US 10,112,418 B2
(45) Date of Patent: Oct. 30, 2018

(54) PART DETECTING DEVICE OF CARRIER TAPE AND PART FEEDING DEVICE

(71) Applicant: Panasonic Intellectual Property Management Co., Ltd., Osaka (JP)

(72) Inventors: Masashi Matsumori, Osaka (JP); Takashi Nakamura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/426,374

(22) Filed: Feb. 7, 2017

(65) Prior Publication Data

US 2017/0259589 A1   Sep. 14, 2017

(30) Foreign Application Priority Data

Mar. 9, 2016   (JP) ................. 2016-045260

(51) Int. Cl.
*H05K 13/04* (2006.01)
*B41J 13/00* (2006.01)
*B41J 15/04* (2006.01)
*B65H 23/04* (2006.01)

(52) U.S. Cl.
CPC ......... *B41J 13/0009* (2013.01); *B41J 15/048* (2013.01); *B65H 23/04* (2013.01); *H05K 13/0417* (2013.01); *B65H 2701/1942* (2013.01)

(58) Field of Classification Search
CPC .. H05K 13/0417; B65H 37/002; B65H 26/02; B65H 2701/1942
See application file for complete search history.

(56) References Cited

U.S. PATENT DOCUMENTS

| | | | | |
|---|---|---|---|---|
| 4,232,346 A | * | 11/1980 | Kobler | G09B 5/04 360/71 |
| 4,683,654 A | * | 8/1987 | Scholten | B65G 47/91 29/740 |
| 5,027,993 A | * | 7/1991 | Ferguson | B41J 29/44 226/24 |
| 5,789,743 A | * | 8/1998 | Van Rosmalen | G11B 7/0025 250/234 |
| 6,901,658 B2 | * | 6/2005 | Ohashi | H05K 13/003 226/120 |
| 7,220,095 B2 | * | 5/2007 | Lyndaker | H05K 13/0417 414/810 |
| 7,819,239 B2 | * | 10/2010 | Wu | H05K 13/0417 156/64 |
| 9,271,417 B2 | * | 2/2016 | Kawaguchi | H05K 13/021 |
| 9,743,569 B2 | * | 8/2017 | Matsumori | H05K 13/0417 |
| 2003/0219330 A1 | | 11/2003 | Lyndaker | |

(Continued)

FOREIGN PATENT DOCUMENTS

JP   2005-539370 A   12/2005
JP   2015-076447 A   4/2015

*Primary Examiner* — Kaitlin S Joerger
(74) *Attorney, Agent, or Firm* — Pearne & Gordon LLP

(57) ABSTRACT

A part detecting device of a carrier tape includes a transporting passage, a part detector, and a biasing mechanism that presses the part detector against the carrier tape inside the transporting passage. The carrier tape is transported to the transporting passage. The part detector detects parts stored in storages which are formed on the carrier tape passing through the transporting passage at regular intervals.

14 Claims, 9 Drawing Sheets

(56) References Cited

U.S. PATENT DOCUMENTS

| | | | |
|---|---|---|---|
| 2010/0163154 A1* | 7/2010 | Masuda | B31F 1/2831 |
| | | | 156/64 |
| 2016/0194171 A1* | 7/2016 | Matsumori | H05K 13/0417 |
| | | | 226/91 |
| 2016/0198595 A1* | 7/2016 | Matsumori | B65H 20/20 |
| | | | 221/13 |
| 2016/0198598 A1* | 7/2016 | Matsumori | H05K 13/0417 |
| | | | 226/1 |
| 2017/0072710 A1* | 3/2017 | Matsumori | H05K 13/0417 |
| 2017/0112030 A1* | 4/2017 | Matsumori | B65H 5/28 |
| 2017/0196132 A1* | 7/2017 | Ohashi | H05K 13/02 |
| 2018/0027709 A1* | 1/2018 | Sugimoto | H05K 13/0408 |
| | | | 29/739 |

* cited by examiner

A-A CROSS-SECTION

B-B CROSS-SECTION

B-B CROSS-SECTION

PART DETECTING DEVICE OF CARRIER TAPE AND PART FEEDING DEVICE

BACKGROUND

1. Technical Field

The present disclosure relates to a part detecting device of a carrier tape for detecting a part stored in a storage of the carrier tape and a part feeding device for transporting the carrier tape and supplying a part to a part mounting apparatus.

2. Description of the Related Art

As a part feeding device in a part mounting apparatus for mounting a part on a substrate, a tape feeder for supplying the part has been widely used in the form of a part feeding tape with a part held in a pocket-type storage. The part feeding tape is set in a state where the part feeding tapes are wound and stored on reels in the predetermined length, and electronic parts are removed from the part feeding tape, that is transported to a part removing position by the tape feeder, by a mounting head of the part mounting apparatus. When all of the part feeding tapes which are stored on one reel are drawn, a shortage of a part occurs, and a new reel is set to replace the reel for additionally feeding the next part feeding tape.

When replacing the reel, "empty tape discharging" for feeding the preceding part feeding tape after removing the last electronic part or a "cue-up operation" for feeding a first part of the part feeding tape to be subsequently fed to the part removing position is performed. When performing a process associated with such a reel replacement, since it is required to detect whether the part exists or not in the storage of the part feeding tape, the tape feeder having a part detecting sensor for detecting the presence or absence of the parts is conventionally known (for example, refer to PTL 1 and PTL 2). In the related art shown in these patent literature publications, the presence or absence of the part in the storage of the part feeding tape is determined by an optical sensor having a light receiver and a light emitter disposed on a transporting passage of the part feeding tape.

CITATION LIST

Patent Literature

PTL 1: PCT Japanese Translation Patent Publication No. 2005-539370

PTL 2: Japanese Patent Unexamined Publication No. 2015-76447

SUMMARY

According to an aspect of the present disclosure, there is provided a part detecting device of a carrier tape including a transporting passage through which a carrier tape is transported, a part detector that detects parts stored in storages which are formed on the carrier tape passing through the transporting passage at regular intervals, and a biasing mechanism that presses the part detector against the carrier tape inside the transporting passage.

According to another aspect of the present disclosure, there is provided a part feeding device including a main body in which a transporting passage for guiding a carrier tape to a part removing position is provided, a tape conveyor that transports the carrier tape inside the transporting passage to the part removing position, a part detector that detects a part in the carrier tape passing through the transporting passage, and a biasing mechanism that presses the part detector against the carrier tape inside the transporting passage, in which a plurality of parts including the part, the plurality of parts stored in storages formed on the carrier tape at regular intervals are transported to the part removing position.

DETAILED DESCRIPTION

Prior to descriptions of an exemplary embodiment of the present disclosure, problems in a related art apparatus will be briefly explained.

In the conventional art detecting the presence or absence by an optical sensor including the above-mentioned prior art example, there are the following drawbacks. That is, since there are various types parts or parts having a various size to be fed by the tape feeder, and also regarding a tape to be used as a carrier of parts in the part feeding tape, there are various types of tapes such as a paper tape for a small-sized part or an embossed tape for storing a large-sized part in an embossed portion. Therefore, the versatility available for the various types of the part feeding tapes as a feeding target is required for the tape feeder.

When detecting the presence or absence of the parts in the storage using an optical sensor for such a various types of parts or the parts having different sizes, regarding part detecting accuracy, the detecting causes the following problems. That is, in a case where the various types of the part feeding tape are set as a target, since the difference between the thicknesses of the part feeding tapes is large depending on the types of the parts, a distance between the light emitter and the light receiver in the optical sensor has to set the part feeding tape having the maximum thickness such as the embossed tape as a target. Therefore, in a case where a thin-type part feeding tape storing a minute part is set as a target, the position of the part feeding tape in the optical sensor in a thickness direction is not stable, and as a result, there is a problem in that the part detecting accuracy becomes unstable.

An object of the present disclosure is to provide a part detecting device of a carrier tape and a part feeding device of the present disclosure have an effect capable of stably detecting the presence or absence of the part in the storage regardless of a type or a thickness of a supplying target part, a type of a carrier tape storing the part, and a difference in a tape thickness. According to the present disclosure, the presence or absence of the part in the storage can be stably detected regardless of a type or a thickness of a supplying target part, a type of a carrier tape storing the part, and a difference in a tape thickness.

Exemplary Embodiments

Figure 1:
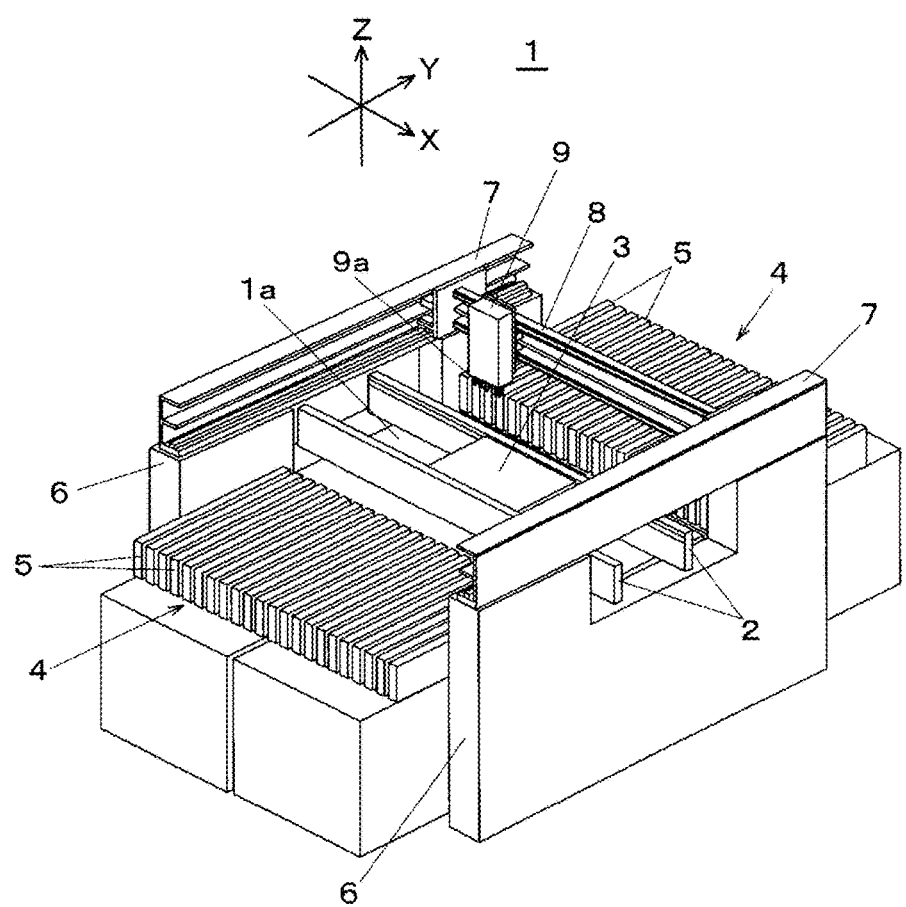
FIG. 1 is a perspective view of a part mounting apparatus using a part feeding device according to an exemplary embodiment of the present disclosure.

Next, an exemplary embodiment of the present disclosure will be described with reference to the drawings. First, a configuration and a function of part mounting apparatus 1 will be described with reference to FIG. 1. In FIG. 1, substrate transporting mechanism 2 is disposed on the upper surface of base mounting portion 1a in an X-direction (substrate transporting direction). Substrate transporting mechanism 2 receives substrate 3 to be subjected to a part mounting work transports the substrate to a mounting work position in part mounting apparatus 1 and positions from an upstream-side apparatus (not shown) and holds the substrate.

Component feeders 4 are disposed on the both sides of substrate transporting mechanisms 2, and in component feeders 4, a plurality of tape feeders 5 are provided respectively. Tape feeder 5 which is a part feeding device for feeding a part to be mounted on part mounting apparatus 1 has a function of transporting part P (refer to FIGS. 7A and 7B) stored in storages 20a formed on carrier tape 11 (refer to FIG. 3) at regular intervals to a part removing position (refer to part removing position 12 shown in FIG. 2) by mounting head 9 to be described below.

Y-axial transfer tables 7 are arranged in a Y-direction, respectively on the upper surface of a pair of frame members 6 disposed on the both end portion of part mounting apparatus 1 in an X-direction. X-axial transfer tables 8 are disposed between Y-axial transfer tables 7 and are moveable in the Y-direction, and mounting head 9 is mounted on X-axial transfer table 8 such that mounting head 9 is moveable in the X-direction. Mounting head 9 has a plurality of adsorption nozzles 9a on the lower surface, and mounting head 9 moves in XY-directions by driving Y-axial transfer table 7 and X-axial transfer table 8. Therefore, mounting head 9 removes part P from storage 20a positioned on part removing position 12 of tape feeder 5 to mounting portion part P on substrate 3.

Figure 2:
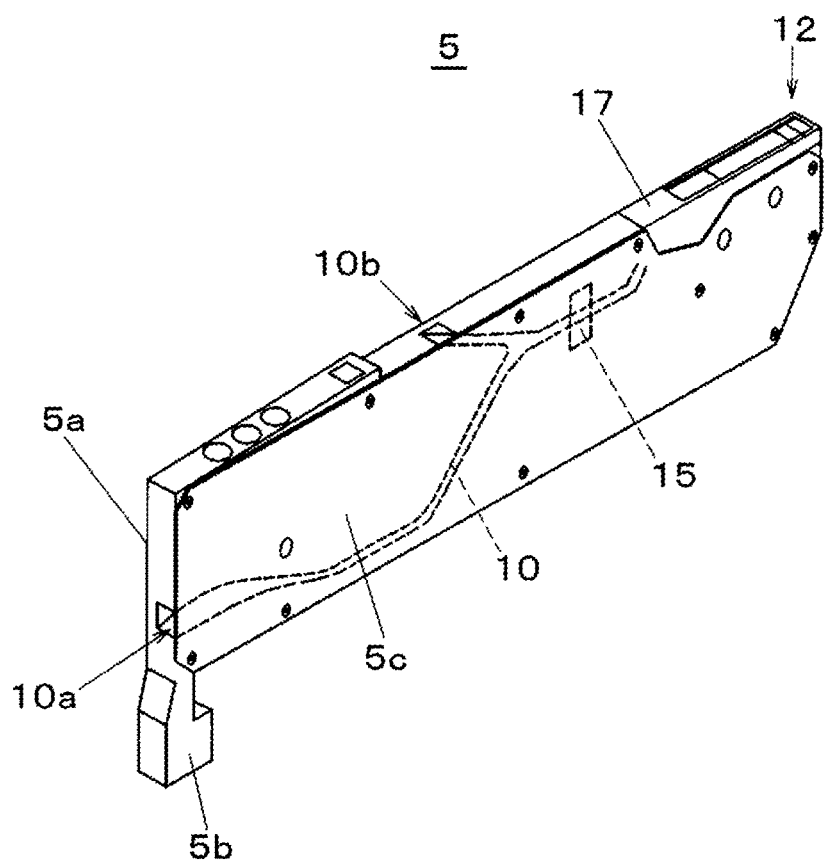
FIG. 2 is a perspective view of the part feeding device according to the exemplary embodiment of the present disclosure.
Figure 3:
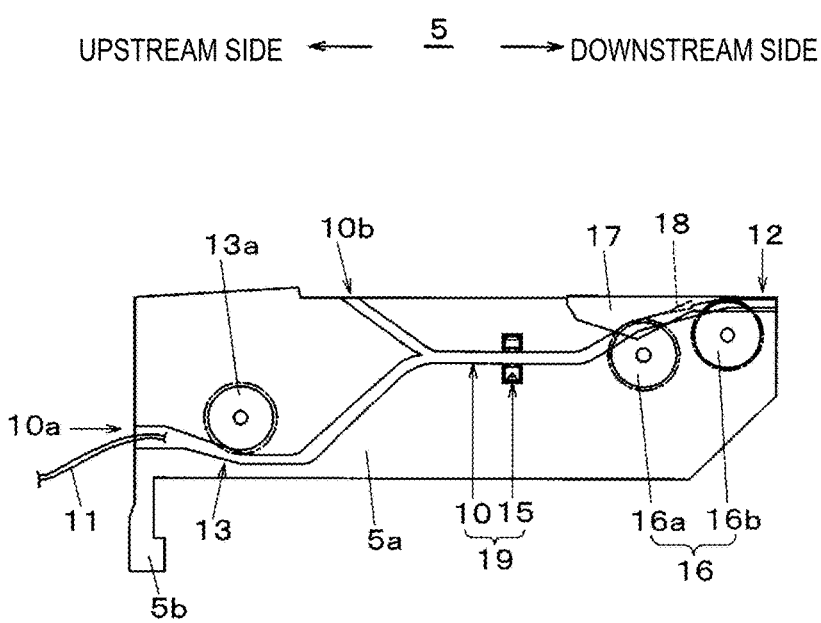
FIG. 3 is an explanatory view of a configuration of the part feeding device according to the exemplary embodiment of the present disclosure.

Next, the configuration and the function of tape feeder 5 will be described with reference to FIGS. 2 and 3. In FIG. 2, tape feeder 5 includes main body portion 5a, mounting portion 5b provided on and projected downward from the lower surface of main body portion 5a, and cover 5c for covering the side surface of main body portion 5a. FIG. 3 conceptually illustrates a front view of tape feeder 5 removing cover 5c. In a state where tape feeder 5 is mounted with the lower surface of main body portion 5a applied along a feeder base (not shown in the drawing) of part mounting apparatus 1, tape feeder 5 is fixed and mounted on the feeder base by mounting portion 5b. A feeder controller that performs controlling such as tape feeding in tape feeder 5 is connected to a device controller (not shown in the drawing) of part mounting apparatus 1.

Transporting passage 10 to which carrier tape 11 taken into tape feeder 5 is transported is provided in main body portion 5a. Transporting passage 10 is provided extending from insertion port 10a, which opens at the end portion of the upstream side (left side in FIG. 1) of tape feeder 5 in a tape feeding direction and inserts carrier tape 11, to part removing position 12 by mounting head 9. Transporting passage 10 has a configuration formed of transporting groove 5d formed on main body portion 5a and long tunnel-like transporting space 10d which covers transporting groove 5d with cover 5c (refer to FIG. 5). At the upstream side which closes to insertion port 10a in transporting passage 10, feeder 13 having feed sprocket 13a to be rotationally driven by a feed motor (not shown) is disposed.

Feeder 13 has a function of transporting carrier tape 11 inserted from insertion port 10a to transporting passage 10 toward part removing position 12. When inserting carrier tape 11 from insertion port 10a to transporting passage 10, feed hole 20b is engaged with feed sprocket 13a, and when detecting the engagement, the feed motor is driven, and carrier tape 11 feeds the tape to the downstream side. A tape standby mechanism (not illustrated) is attached to feeder 13. Thus, in a state where tape feeding of carrier tape 11, which is sent first and to be subjected to part removing (hereinafter, referred to as a "preceding tape"), is continuously performed, next carrier tape 11 (hereinafter, referred to as a "following tape"), which is additionally inserted from insertion port 10a, can wait until a predetermined tape feeding timing is reached.

At the most upstream side of part removing position 12 in transporting passage 10, tape conveyor 16 having two sprockets of first sprocket 16a and second sprocket 16b, which are driven by the same driving source, is disposed. Tape conveyor 16 has a function of positioning storage 20a of carrier tape 11 transported toward part removing position 12 to part removing position 12 by performing a pitch feeding of carrier tape 11 engaged with first sprocket 16a and second sprocket 16b, and transporting empty carrier tape 11 to the outside after part P is removed from part removing position 12.

The upper portion of tape conveyor 16 is covered with cover member 17, and cover tape processor 18 is disposed on the rear surface of cover member 17. Cover tape 21 is separated from carrier tape 11 to be fed for feeding tape by tape conveyor 16, by using a stripping claw of cover tape processor 18 at the upstream side of part removing position 12, or cover tape 21 is cut off by using a cutting blade, and part P stored in storage 20a becomes an exposed state. Therefore, part P can be picked up from storage 20a fed to part removing position 12 by mounting head 9 which is included in the part mounting apparatus.

That is, in the present exemplary embodiment, cover tape processor 18 for peeling off or cutting open cover tape 21 covering storage 20a of carrier tape 11 to expose part P of storage 20a is provided on transporting passage 10, and transporting passage 10 has a configuration in which part detector 15 is further provided than cover tape processor 18. Part detector 15 that detects part P inside carrier tape 11 passing through transporting passage 10 is provided on the upstream side of tape conveyor 16 in transporting passage 10.

Manual feed port 10b which is opened in the upper surface of main body portion 5a at the upstream side of part detector 15 is provided on transporting passage 10. Regarding the feeding of carrier tape 11 to tape feeder 5, in a case where carrier tape 11 is fed in a manual feed manner, manual feed port 10b is used instead of insertion from insertion port 10a.

Figure 4:
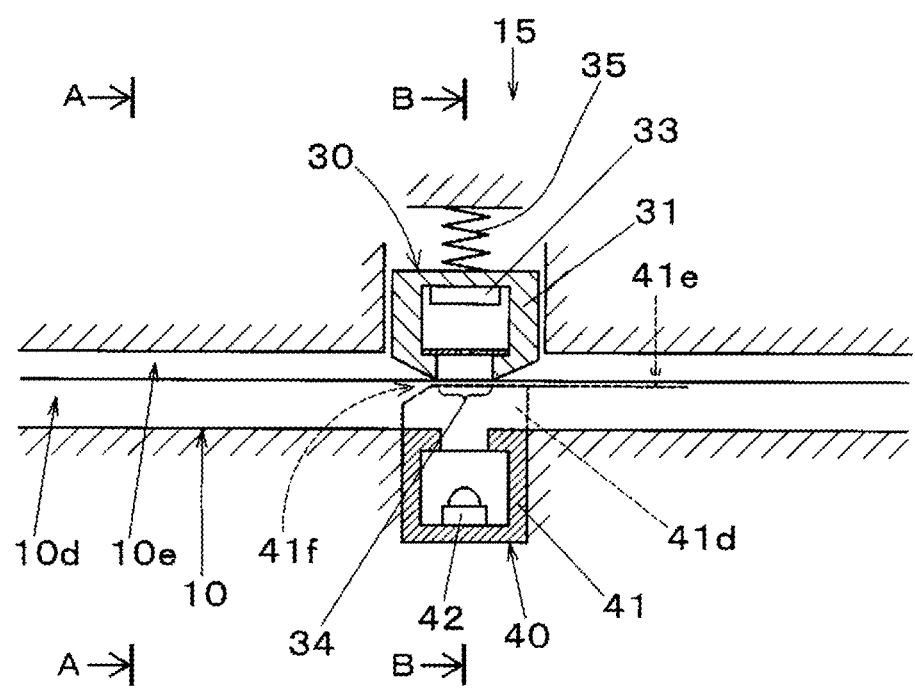
FIG. 4 is a shape explanatory view of a transporting passage of a carrier tape in the part feeding device according to the exemplary embodiment of the present disclosure.

Next, a configuration of part detector 15 disposed on transporting passage 10 will be described with reference to FIG. 4. As illustrated in FIG. 4, part detector 15 is light receiver 30 that detects light emitted by light emitter 40. That is, light receiver 30 as part detector 15 detects the presence or absence of part P in storage 20a of carrier tape 11 passing through transporting passage 10 by detecting light for detecting emitted by light emitting element 42 of light emitter 40 by light receiving element 33.

Light emitter 30 and light receiver 40 are disposed so as to pinch transporting passage 10 and light receiver 30 is disposed so as to be positioned on the upper surface side of carrier tape 11 to be detected. At the time of part detection, light receiver 30 as part detector 15 presses carrier tape 11 inside transporting passage 10 by spring member 35 (compression spring) that is a biasing mechanism. In the configuration, transporting passage 10, part detector 15, and spring member 35 that is the biasing mechanism configure part detecting device 19 of a carrier tape that detects part P stored in storages 20a formed on carrier tape 11 at regular intervals.

By including the biasing mechanism pressing light receiver 30 against carrier tape 11, carrier tape 11 to be transported along transporting passage 10 is transported in a state where contactor 34 of the lower surface of light receiver 30 is always in contact with the upper surface side, and can stably detect the presence or absence of the part. A configuration other than spring member 35 can be used as the biasing mechanism as long as a member can bias light receiver 30 downward.

Figure 5:
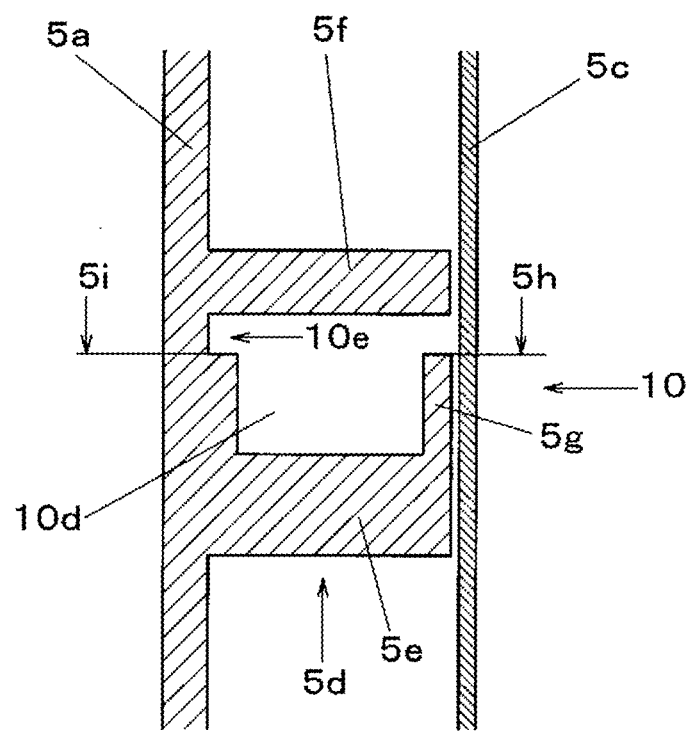
FIG. 5 is an explanatory view of a cross-section shape of the transporting passage of the carrier tape in the part feeding device according to the exemplary embodiment of the present disclosure.

Here, a cross-sectional configuration of transporting passage 10 will be described with reference to FIG. 5 illustrating an A-A cross-section in FIG. 4. In FIG. 5, transporting groove 5d is projected in main body portion 5a along a disposing passage of transporting passage 10. Transporting groove 5d has lower portion 5e in which transporting space 10d for transporting carrier tape 11 is formed and upper portion 5f covering transporting space 10d from above, and side portion 5g extruding upwardly is provided on an end portion of lower portion 5e. In addition, groove 10e is provided on the upper end portion of main body portion 5a side of transporting space 10d. Upper surface 5h of side portion 5g and bottom surface 5i of groove 10e have the same height level and function as a transportation supporting surface that supports the end portion of carrier tape 11 when transporting carrier tape 11.

Figure 6:
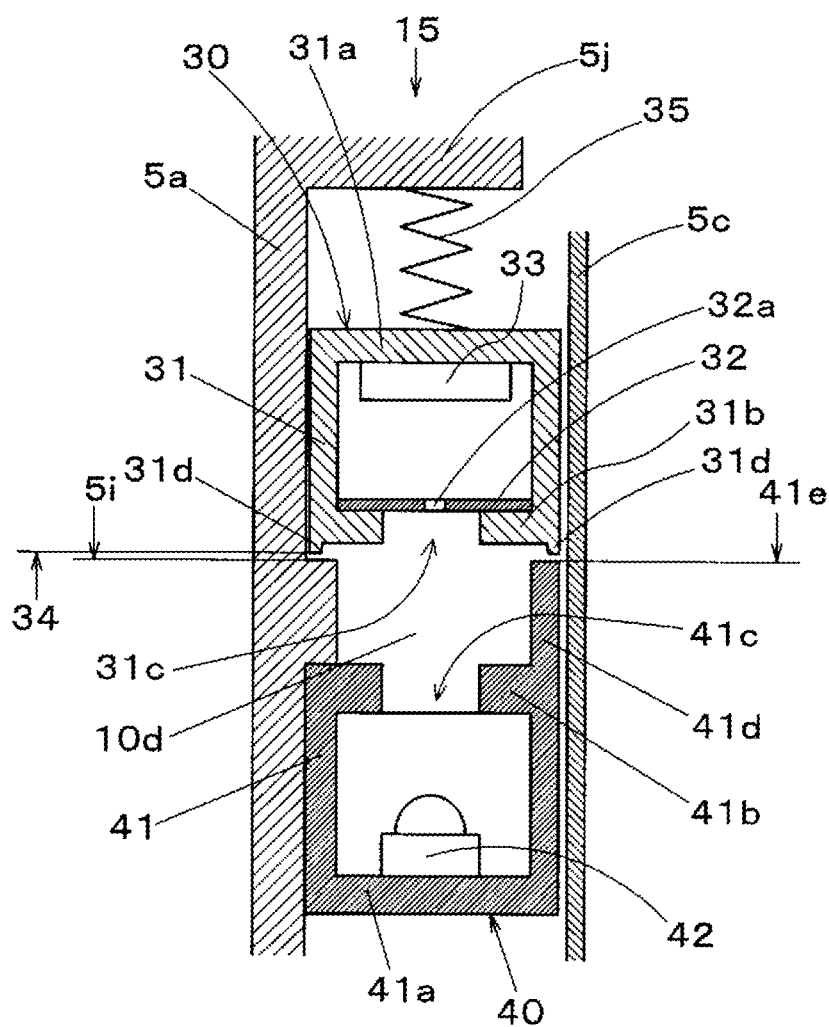
FIG. 6 is a cross-sectional view illustrating a configuration of a part detector in a part detecting device of a carrier tape according to the exemplary embodiment of the present disclosure.

Next, a configuration and a function of part detector 15 will be described with reference to FIG. 6 illustrating a B-B cross-section in FIG. 4. In FIG. 6, light emitter 40 is mainly composed of a hollow light projecting block 41 having lower portion 41a and upper portion 41b. Light emitting element 42 is disposed on the upper surface of lower portion 41a such that the light emitting surface faces upward. Opening 41c is passed through and provided on upper portion 41b. By operating light emitting element 42, the emitted light is radiated to light receiver 30 at the upper side through opening 41c.

Side end portion 41d projecting upward is provided on the side end portion facing main body portion 5a of upper portion 41b. In the same manner as upper surface 5h in the A-A cross-section illustrated in FIG. 5, upper surface 41e of side end portion 41d functions as a transportation supporting surface that supports the end portion of carrier tape 11 when transporting carrier tape 11. The upstream side of upper surface 41e servers as guide surface 41f (refer to FIG. 4) that guides carrier tape 11 which is cut in a tape-shape. When attaching light projecting block 41, light projecting block 41 fixes to main body portion 5a such that height of the upper surface 41e of side end portion 41d is the same as that of bottom surface 5i.

Light receiver 30 is mainly composed of a hollow light receiving block 31 having a space between upper portion 31a and lower portion 31b. Lower portion 31b is provided with opening 31c penetrating therethrough, and light receiving element 33 is disposed on the lower surface of upper portion 31a in a posture in which light receiving surface faces downward. Protrusion 31d that functions as above-described contactor 34 is positioned on the both side ends and projected in the lower surface of lower portion 31b. Furthermore, throttle 32 having a function that restricts light reaching light receiving element 33 by drawing penetrating hole 32a which is provided on the central position is disposed on the upper surface of lower portion 31b.

Spring member 35 that is the biasing mechanism is mounted between upper portion 31a of light receiving block 31 and supporter 5j extending from main body portion 5a. Spring member 35 biases light receiving block 31 downward. Accordingly, protrusion 31d as contactor 34 is in contact with the upper surfaces of carrier tapes 11 and 11A disposed on part detector 15. At this time, the position and the shape are set such that protrusion 31d is in contact with the upper surface of carrier tape 11 other than storage 20a and feed hole 20b formed on carrier tape 11 to subjected to part detection. Accordingly, by contacting protrusion 31d with the upper surfaces of carrier tapes 11 and 11A, there is no hindrance to the transporting of carrier tape 11 and part detection in storage 20a.

By biasing light receiver 30 downward by spring member 35, storage 20a to be detected passes through part detector 15 in a state where carrier tapes 11 and 11A are transported along transporting passage 10 and cover tape 21 (refer to FIGS. 7A and 7B) at the upper surfaces of carrier tapes 11 and 11A is in contact with contactor 34. That is, light receiver 30 includes contactor 34 contacting with the upper surfaces of carrier tapes 11 and 11A and light receiving element 33 disposed on the position apart from contactor 34.

The light emitted from light emitter 40 is received by light receiving element 33 through opening 31c and drawing penetrating hole 32a. At this time, by receiving the light to light receiving element 33 through drawing penetrating hole 32a, amount of light that reaches light receiving element 33 is restricted. That is, in the light receiver 30, throttle 32 that restricts the light reaching light receiving element 33 is disposed between contactor 34 and the light receiving element 33.

In the part feeding for feeding carrier tapes 11 and 11A in tape feeder 5, when storage 20a to be inspected reaches an inspection position by part detector 15, the part detection is performed. That is, by receiving the light which is emitted from light emitting element 42 and passed through storage 20a by light receiving element 33 through drawing penetrating hole 32a, the presence or absence of part P in storage 20a is detected.

In the exemplary embodiment as described above, regarding the detection of the presence or absence of part P in storage 20a of carrier tape 11 by part detector 15, an example, in which transmitted light detecting for detecting light that has passed through carrier tape 11 radiated from light emitting element 42 by light receiving element 33, is performed, is described. In addition to the example, other various detecting methods can be used. For example, detecting the presence or absence of part P in storage 20a may be performed by detecting the reflected light from part P in storage 20a instead of receiving the light from light emitting element 42 that has passed through storage 20a of carrier tape 11. In this case, a projector for radiating the light is provided on the upper side of transporting passage 10, and the projector is disposed such that the light in which the irradiation light is reflected from part P in storage 20a can be received in light receiver 30.

Furthermore, as a detecting element in part detector 15, a magnetic sensor can be used. That is, when part P in storage 20a has a metallic portion and has characteristics of reacting to a magnetic field, the magnetic sensor is disposed on a position corresponding to opening 31c of light receiver 30. When storage 20a having passed through the part detector while causing cover tape 21 to be in contact with contactor 34 approaches the magnetic sensor, the presence of part P in storage 20a is detected by detecting signals which is issued when part P having the metallic portion in storage 20a approaches the magnetic sensor.

Figure 7A:
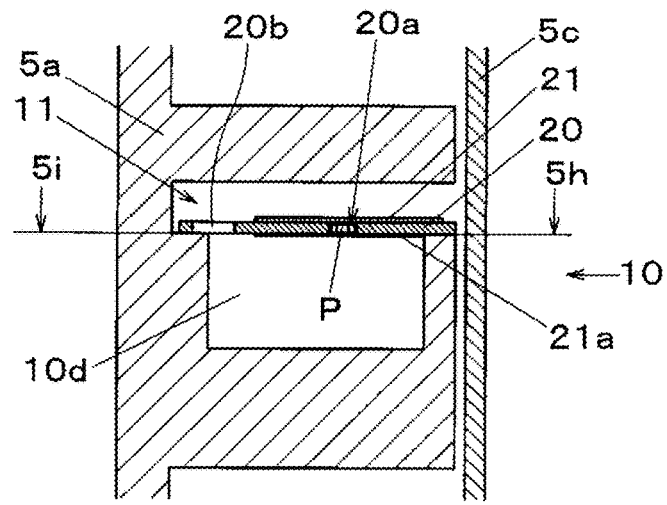
FIG. 7A is an explanatory view of a transporting state of the carrier tape in the part feeding device according to the exemplary embodiment of the present disclosure.

Next, a transporting state in transporting passage 10 of carrier tapes 11 and 11A to be subjected to part detection in the present exemplary embodiment will be described with reference to FIGS. 7A and 7B. Firstly, FIG. 7A illustrates a transporting state to be a target of carrier tape 11 formed of a paper tape having a thin thickness. As illustrated in the cross-section of FIG. 7A, carrier tape 11 has a configuration in which cover tape 21 and bottom tape 21a are attached to the upper surface and the lower surface of base tape 20 in which storage 20a and feed hole 20b are formed, respectively, and small-sized part P is stored in storage 20a. In the transportation of carrier tape 11, transporting space 10d of transporting passage 10 becomes an empty space.

Figure 7B:
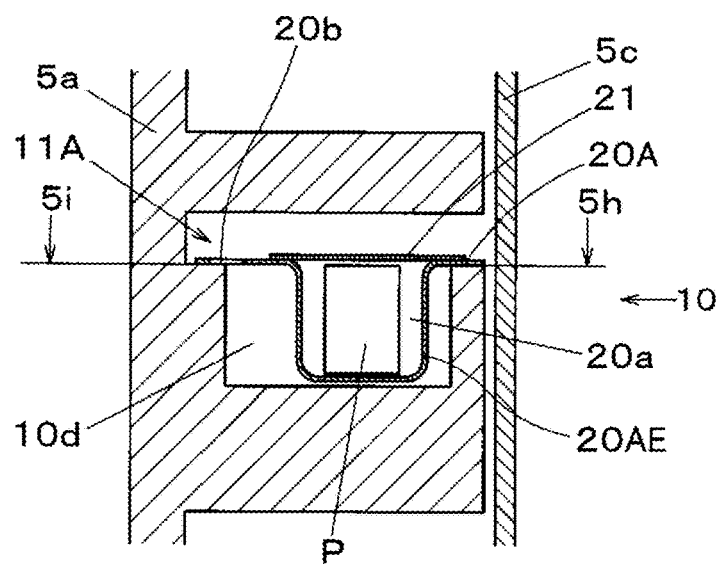
FIG. 7B is an explanatory view of the transporting state of the carrier tape in the part feeding device according to the exemplary embodiment of the present disclosure.

Next, FIG. 7B illustrates a transporting state in which carrier tape 11A that stores part P in an embossed portion and has a large thickness is set as a target. As illustrated in the cross-section of FIG. 7B, carrier tape 11A has a configuration in which cover tape 21 is attached to the upper surfaces of base tape 20A on which feed hole 20b and embossed portion 20AE projecting toward the lower surface side are formed, and large-sized part P is stored inside storage 20a. In the transportation of carrier tape 11A, embossed portion 20AE is stored inside transporting space 10d of transporting passage 10.

Figure 8A:
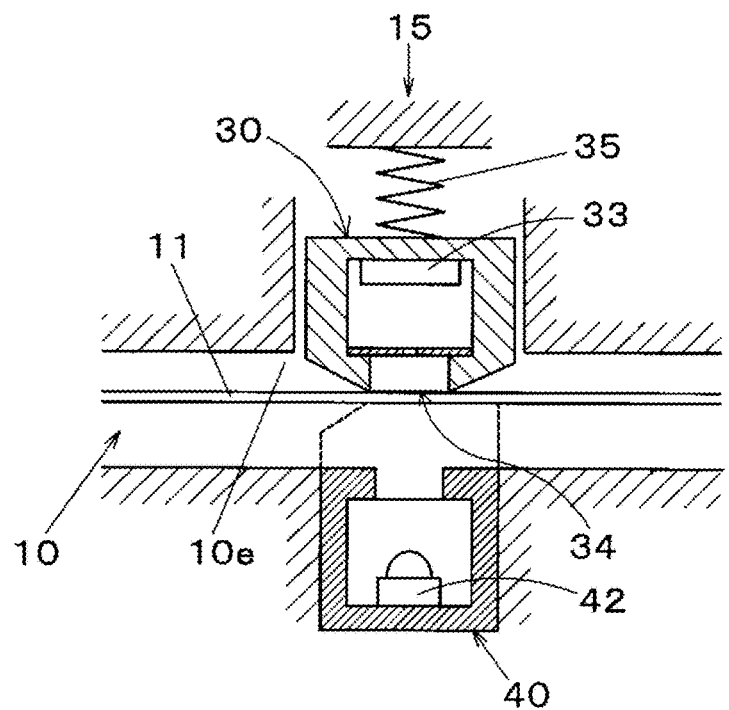
FIG. 8A is an explanatory view of part detection of the carrier tape in the part feeding device according to the exemplary embodiment of the present disclosure.

Next, part detection to be performed by part detector 15 in tape feeder 5 will be described with reference to FIGS. 8A and 8B. Firstly, FIG. 8A illustrates a state where part detection of carrier tape 11 formed of a paper tape having a thin thickness as a target is performed by part detector 15. In this case, all of base tape 20, cover tape 21, and bottom tape 21a which configure carrier tape 11 are transported along inside groove 10e (refer to also FIG. 7A).

In a state where storage 20a to be inspected reaches part detector 15, from the fact that contactor 34 of light receiver 30 always presses carrier tape 11 by spring member 35 that is the biasing mechanism, carrier tape 11 passes through a detection position by part detector 15 in a state where cover tape 21 at the upper surface is in contact with contactor 34 at the lower surface of light receiver 30. Even in a case where carrier tape 11 which is a paper tape having a thin thickness and is easy to bend is set to an inspection target, the presence or absence of part P in storage 20a can be stably detected.

Figure 8B:
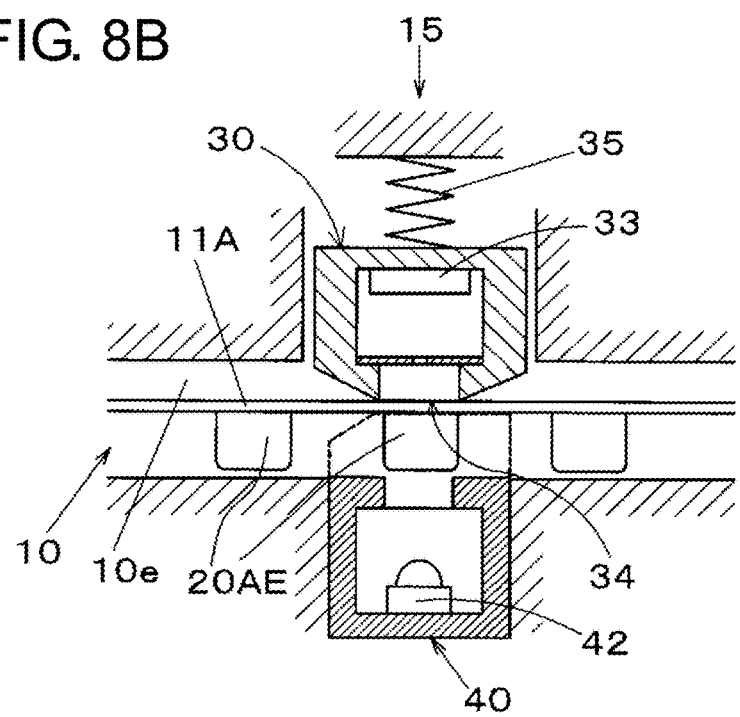
FIG. 8B is an explanatory view of part detection of the carrier tape in the part feeding device according to the exemplary embodiment of the present disclosure.

FIG. 8B illustrates a state where part detection is performed by part detector 15 in which carrier tape 11A having embossed portion 20AE projecting toward the lower surface side is set as a target. In this case, base tape 20A, and cover tape 21 among base tape 20A, cover tape 21, and embossed portion 20AE which configure carrier tape 11A are transported along inside groove 10e, and embossed portion 20AE is transported in a state where embossed portion 20AE is stored in transporting space 10d (refer to also FIG. 7B).

Similarly, in a state where storage 20a to be inspected reaches part detector 15, carrier tape 11A passes through the detection position by part detector 15 in a state where cover tape 21 at the upper surface is in contact with contactor 34 at the lower surface of light receiver 30. Even in a case where carrier tape 11A having embossed portion 20AE projecting toward the lower surface side is set to an inspection target, the presence or absence of part P in storage 20a can be stably detected.

Figure 9:
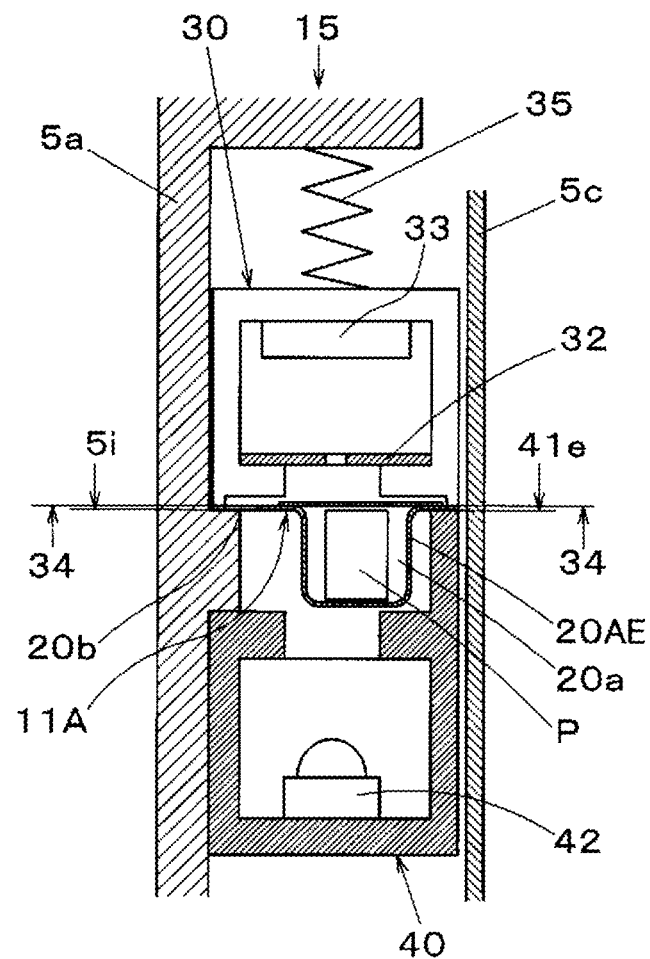
FIG. 9 is an explanatory view of part detection of the carrier tape in the part feeding device according to the exemplary embodiment of the present disclosure.

FIG. 9 illustrates a cross-section (corresponds to the B-B cross-section illustrated in FIG. 6) of part detector 15 in the part detection which uses carrier tape 11A as a target illustrated in FIG. 8B. In this state, base tape 20A and cover tape 21 (refer to FIG. 7B) are pinched at contactor 34 at the lower surface of light receiver 30 which is pressed by spring member 35, that is, between protrusion 31d and carrier tape 11A between upper surface 41e and bottom surface 5i that functions as the transportation supporting surface illustrated in FIG. 6 and storage 20a is positioned close to light receiver 30. Thus, as illustrated, the presence or absence of part P in storage 20a can be stably detected.

The above-described part detection is performed by causing storage 20a which is provide on carrier tapes 11 and 11A at a predetermined pitch passing through part detector 15 by pitch-feeding carrier tapes 11 and 11A by tape conveyor 16. At this time, when carrier tapes 11 and 11A are fed, firstly, an empty part at the leading portion of the tape, that is, a portion in which a plurality of empty storages 20a in which part P does not exist are continuous passes through part detector 15. In a process in which the empty part of the leading portion of the tape passes through part detector 15, if part detector 15 detects leading part P, tape conveyor 16 transports and positions leading part P to part removing position 12.

Thereafter, pitch-feeding of carrier tapes 11 and 11A is continuously performed, and part detection in which next storage 20a is used as a target is sequentially performed. When all of parts P stored in carrier tapes 11 and 11A are removed, the empty part at the end portion of the tape, that is, a portion in which a plurality of empty storages 20a in which part P does not exist are continuous passes through part detector 15. In a process in which the empty part of the end portion of the tape passes through part detector 15, if part detector 15 detects a plurality of portions in which empty storage 20a is continuous, tape conveyor 16 transmits a notice that remaining number of parts P of carrier tapes 11 and 11A is reached a predetermined number, that is a notification of part cut off to part mounting apparatus 1. Thereafter, when all of remaining parts P are consumed by part mounting apparatus 1 and part is cut off, part mounting apparatus 1 notifies tape feeder 5 of the notification. Tape feeder 5 receives the notification and transports carrier tapes 11 and 11A inside transporting passage 10 to outside tape feeder 5.

As described above, in the part detecting device of a carrier tape and the part feeding device of the exemplary embodiment, a configuration in part detector 15 that detects parts P inside carrier tapes 11 and 11A passing through transporting passage 10 by light emitter 40 and light receiver 30 is disposed in transporting passage 10 in which carrier tapes 11 and 11A are transported is provided, and spring member 35 as the biasing mechanism presses light receiver 30 of part detector 15 against carrier tapes 11 and 11A. Thus, carrier tapes 11 and 11A to be detected are always transported by contacting with contactor 34 of light receiver 30, and the presence or absence of part P in storage 20a can be stably detected regardless of a type or a thickness of a supplying target part, a type of a carrier tape storing the part, and a difference in a tape thickness.

Conclusion

Part detecting device 19 of a carrier tape of the present disclosure includes transporting passage 10, part detector 15, and a biasing mechanism that presses part detector 15 against carrier tape 11 (or carrier tape 11A) inside transporting passage 10. Carrier tape 11 (or carrier tape 11A) is transported to transporting passage 10. Part detector 15 detects parts P stored in storages 20a which are formed on carrier tape 11 (or carrier tape 11A) passing through transporting passage 10 at regular intervals.

The part feeding device (tape feeder 5) of the present disclosure includes main body portion 5a in which transporting passage 10 for guiding carrier tape 11 (or carrier tape 11A) to a removing position is provided, tape conveyor 16 that transports carrier tape 11 (or carrier tape 11A) inside transporting passage 10 to part removing position 12, part detector 15 that detects part P in carrier tape 11 (or carrier tape 11A) passing through transporting passage 10, and a biasing mechanism that presses part detector 15 against carrier tape 11 (or carrier tape 11A) inside transporting passage 10. The part feeding device (tape feeder 5) of the present disclosure transports parts P stored in storages 20a which are formed on carrier tape 11 (or carrier tape 11A) at regular intervals to part removing position 12.

The part detecting device of a carrier tape and the part feeding device of the present disclosure have an effect capable of stably detecting the presence or absence of the part in the storage regardless of a type or a thickness of a supplying target part, a type of a carrier tape storing the part, and a difference in a tape thickness and are effective to a field of mounting the part to be supplied by a carrier tape on a substrate.

What is claimed is:

1. A part detecting device of a carrier tape comprising:
a transporting passage through which a carrier tape is transported;
a part detector that detects parts stored in storages which are formed on the carrier tape passing through the transporting passage at regular intervals; and
a biasing mechanism that presses the part detector against the carrier tape inside the transporting passage.

2. The part detecting device of a carrier tape of claim 1, wherein the part detector is a light receiver that detects light emitted from a light emitter,
wherein the light emitter and the light receiver are disposed so that the transporting passage is located between the light emitter and the light receiver, and
wherein the biasing mechanism presses the light receiver against the carrier tape inside the transporting passage.

3. The part detecting device of a carrier tape of claim 2, wherein the light receiver is disposed on an upper surface side of the carrier tape.

4. The part detecting device of a carrier tape of claim 3, wherein the light receiver includes
a contactor that contacts an upper surface of the carrier tape, and
a light receiving element that is disposed at a position apart from the contactor.

5. The part detecting device of a carrier tape of claim 4, wherein a throttle that restricts the light reaching the light receiving element is disposed between the contactor and the light receiving element.

6. The part detecting device of a carrier tape of claim 4, wherein the contactor contacts a feeding hole formed on the carrier tape and a front surface of the carrier tape outside the storages.

7. A part feeding device comprising:
a main body in which a transporting passage for guiding a carrier tape to a part removing position is provided;
a tape conveyor that transports the carrier tape inside the transporting passage to the part removing position;
a part detector that detects a part in the carrier tape passing through the transporting passage; and
a biasing mechanism that presses the part detector against the carrier tape inside the transporting passage,
wherein a plurality of parts including the part, the plurality of parts stored in storages formed on the carrier tape at regular intervals are transported to the part removing position.

8. The part feeding device of claim 7,
wherein the part detector is a light receiver that detects light emitted by a light emitter,
wherein the light emitter and the light receiver are disposed so that the transporting passage is located between the light emitter and the light receiver, and
wherein the biasing mechanism presses the light receiver against the carrier tape inside the transporting passage.

9. The part feeding device of claim 8,
wherein the light receiver is disposed on an upper surface side of the carrier tape.

10. The part feeding device of claim 9,
wherein the light receiver includes
a contactor that contacts an upper surface of the carrier tape, and
a light receiving element that is disposed at a position apart from the contactor.

11. The part feeding device of claim 10,
wherein a throttle that restricts the light reaching the light receiving element is disposed between the contactor and the light receiving element.

12. The part feeding device of claim 10,
wherein the contactor contacts a feeding hole formed on the carrier tape and a front surface of the carrier tape outside the storages formed on the carrier tape.

13. The part feeding device of claim 7,
wherein, if the part detector detects a leading part, the tape conveyor transports and positions the leading part to the part removing position.

14. The part feeding device of claim 7,
wherein, if the part detector detects a plurality of empty storages continuously, the tape conveyor is configured to issue a notification of part cutoff to a part mounting apparatus.

* * * * *